(12) United States Patent
Morihana et al.

(10) Patent No.: US 9,916,997 B2
(45) Date of Patent: Mar. 13, 2018

(54) END STRUCTURE OF NOZZLE, PURGING DEVICE, AND LOAD PORT

(71) Applicant: SINFONIA TECHNOLOGY CO., LTD., Minato-ku (JP)

(72) Inventors: Toshimitsu Morihana, Minato-ku (JP); Yuki Matsumoto, Minato-ku (JP); Mitsuo Natsume, Minato-ku (JP)

(73) Assignee: SINFONIA TECHNOLOGY CO., LTD., Minato-ku (JP)

( * ) Notice: Subject to any disclaimer, the term of this patent is extended or adjusted under 35 U.S.C. 154(b) by 40 days.

(21) Appl. No.: 15/072,823

(22) Filed: Mar. 17, 2016

(65) Prior Publication Data
US 2016/0276188 A1 Sep. 22, 2016

(30) Foreign Application Priority Data
Mar. 20, 2015 (JP) .................... 2015-057368

(51) Int. Cl.
*H01L 21/67* (2006.01)
*H01L 21/673* (2006.01)

(52) U.S. Cl.
CPC ............... *H01L 21/67393* (2013.01)

(58) Field of Classification Search
CPC ....... B65B 31/04; B65B 31/042; B65B 55/00; B65B 55/12; B65B 55/18
USPC ......................... 141/65, 66, 69, 98
See application file for complete search history.

(56) References Cited

U.S. PATENT DOCUMENTS

| | | | | |
|---|---|---|---|---|
| 2,243,463 A | * | 5/1941 | Kerr | B67C 3/246 141/286 |
| 2,543,788 A | * | 3/1951 | Loveland | B65B 31/044 141/305 |
| 5,150,740 A | * | 9/1992 | Yun | B67C 3/2628 141/40 |
| 5,398,481 A | * | 3/1995 | Takeuchi | H01L 21/67772 53/405 |
| 5,879,458 A | * | 3/1999 | Roberson, Jr. | H01L 21/67017 118/715 |
| 6,164,664 A | * | 12/2000 | Fosnight | F16J 15/025 277/635 |

(Continued)

FOREIGN PATENT DOCUMENTS

JP 2011-187539 9/2011

*Primary Examiner* — Timothy L Maust
(74) *Attorney, Agent, or Firm* — Oblon, McClelland, Maier & Neustadt, L.L.P.

(57) ABSTRACT

There is provided an end structure of a nozzle (11) including a gas-flow passage (13) communicable with an opening (104) provided through a bottom of a container (100) configured to contain an object, the nozzle (11) configured so that gas is injected into or discharged from the container (100) through the gas-flow passage (13) and the opening (104). The end structure includes a contact portion (19) provided at an upper end portion of the nozzle (11) and around the gas-flow passage (13), and the contact portion (19) is configured to be brought into contact with a contacted portion (103) provided around the opening (104). The contact portion (19) includes a flat portion (19b) and protruding portions (19a and 19c) each protruding upward relative to the flat portion (19b), and the flat portion (19b) is made of material softer than that of the protruding portions (19a and 19c).

17 Claims, 6 Drawing Sheets

(56) References Cited

U.S. PATENT DOCUMENTS

| | | | | |
|---|---|---|---|---|
| 7,328,727 B2* | 2/2008 | Tieben | .............. | H01L 21/67379 141/11 |
| 7,661,449 B2* | 2/2010 | Stavrakis | .................. | B67C 3/26 141/302 |
| 8,146,623 B2* | 4/2012 | Tieben | .............. | H01L 21/67017 141/286 |
| 8,596,312 B2* | 12/2013 | Natsume | ........... | H01L 21/67775 141/63 |
| 2005/0178466 A1* | 8/2005 | Tanikawa | .............. | B67C 3/2614 141/57 |
| 2011/0214778 A1 | 9/2011 | Natsume et al. | | |

* cited by examiner

END STRUCTURE OF NOZZLE, PURGING DEVICE, AND LOAD PORT

CROSS REFERENCE TO RELATED APPLICATION

The present application claims priority from Japanese Patent Application No. 2015-057368, which was filed on Mar. 20, 2015, the disclosure of which is herein incorporated by reference in its entirety.

BACKGROUND OF THE INVENTION

The present invention relates to: an end structure of a nozzle configured so that gas is injected into or discharged from a container containing an object; and a purging device and a load port each including a nozzle unit having the end structure.

There are containers such as a FOUP (front-opening unified pod) configured to contain wafers which are material for semiconductor devices. The internal space of such a container is purged with inert gas such as nitrogen gas to prevent contamination of wafers. For example, referring to an apparatus described in Patent Literature 1 (Japanese Unexamined Patent Publication No. 2011-187539), nozzles each having a gas-flow passage are brought into contact with the bottom of a FOUP to cause each gas-flow passage to communicate with a corresponding opening formed through the bottom of the FOUP. In this state, purging is performed.

If there is any gap between the nozzles and the FOUP during purging, gas leakage occurs. Therefore, the nozzles have to be brought into close contact with the FOUP. In view of the above, in Patent Literature 1, a rubber grommet is attached to each opening of the FOUP. Further, at an upper end portion of each nozzle, a lip-shaped protruding portion protruding upward is provided around the gas-flow passage. Each nozzle is configured so that its protruding portion is brought into contact with the corresponding grommet when the nozzle is moved upward. Because each grommet is made of rubber and soft, good and close contact is established between the protruding portion and the grommet at this time. With this, gas leakage during purging is prevented.

SUMMARY OF THE INVENTION

There are a variety of containers such as FOUPs. For example, the FOUP described in Patent Literature 1 is of a so-called "grommet type", with the rubber grommet provided around each opening of the FOUP. Meanwhile, there are FOUPs of a so-called "lip type", each having a lip member provided around each opening of the FOUP. The lip member is a lip-shaped protruding portion formed to surround the opening of the FOUP. The lip member is generally formed integrally with a valve made of plastic or the like.

For grommet type FOUPs, nozzles each having a lip-shaped protruding portion provided at its upper end portion are used, as described in Patent Literature 1, to establish good and close contact between the nozzles and the corresponding grommets, for preventing gas leakage during purging. Meanwhile, for lip type FOUPs, nozzles each having a portion made of relatively soft material is provided at its upper end portion, to establish good and close contact between the nozzles and the corresponding lip members.

As described above, there are grommet type and lip type containers (FOUPs), and there are multiple types of nozzles respectively corresponding thereto. Thus, there has been troublesome necessity of changing nozzles with the change of the type of the container used. Further, because different nozzles have been used for the grommet type containers and the lip type containers, it has been impossible to deal with the situation where the grommet type and lip type containers are used in a mixed manner.

In view of the above, an object of the present invention is to provide a nozzle compatible with both of the grommet type containers and the lip type containers.

According to an aspect of the present invention, there is provided an end structure of a nozzle including a gas-flow passage communicable with an opening provided through a bottom of a container configured to contain an object, the nozzle being configured so that gas is injected into or discharged from the container through the gas-flow passage and the opening. The end structure includes a contact portion provided at an upper end portion of the nozzle and around the gas-flow passage, the contact portion being configured to be brought into contact with a contacted portion provided around the opening. The contact portion includes a flat portion and a protruding portion protruding upward relative to the flat portion, the flat portion being made of material softer than that of the protruding portion.

In this aspect, the contact portion of the nozzle configured to be brought into contact with the contacted portion of the container includes the flat portion and the protruding portion protruding upward relative to the flat portion. Further, the flat portion is made of material softer than that of the protruding portion. Because of this structure, when the container is a grommet type container, the protruding portion of the nozzle is brought into contact with a grommet (contacted portion) of the container, and thereby good and close contact is established between the nozzle and the container. Meanwhile, when the container is a lip type container, the flat portion which is softer than the protruding portion is brought into contact with a lip member (contacted portion) of the container, and thereby good and close contact is established between the nozzle and the container. Thus, according to this aspect, there is provided a nozzle compatible with both of the grommet type containers and the lip type containers.

In the above aspect, it is preferable that the protruding portion is provided between the gas-flow passage and the flat portion.

The protruding portion is generally formed integrally with a nozzle main body made of metal. Meanwhile, the flat portion is formed by a rubber member or the like which is softer than the nozzle main body and which is placed on an upper surface of the nozzle main body. Due to this structure, there is a possibility that a gap is created an under surface of the flat portion and the upper surface of the nozzle main body, and this gap may function as a path of gas leakage. Thus, as described above, the protruding portion is provided between the gas-flow passage and the flat portion. The protruding portion prevents gas from reaching the gap, to reliably prevent gas leakage.

Further, it is preferable that the protruding portion is provided outside the flat portion.

As described above, the flat portion is made of relatively soft material such as rubber, and therefore the flat portion is more likely to be damaged by contact with another member, for example. Thus, by providing the protruding portion outside the flat portion, the soft flat portion is protected by the protruding portion. Thereby, damage to the flat portion is prevented.

According to another aspect of the present invention, a purging device includes: a table configured so that a container is placed thereon; and a nozzle unit installed in the table. The purging device is configured so that gas is injected into or discharged from the container through the nozzle unit, and the nozzle unit includes the end structure described above.

According to still another aspect of the present invention, a load port provided adjacent to a semiconductor manufacturing device includes: the purging device described above, and a mechanism configured to open/close a door of a container placed on the table of the purging device.

The above-described purging device and the load port enable suitable purging of both of the grommet type containers and the lip type containers without the need of replacing the nozzle.

In the present invention, the contact portion of the nozzle configured to be brought into contact with the contacted portion of the container includes the flat portion and the protruding portion protruding upward relative to the flat portion. Further, the flat portion is made of material softer than that of the protruding portion. Thus, there is provided the nozzle compatible with both of the grommet type containers and the lip type containers.

DESCRIPTION OF THE PREFERRED EMBODIMENTS

Figure 1:
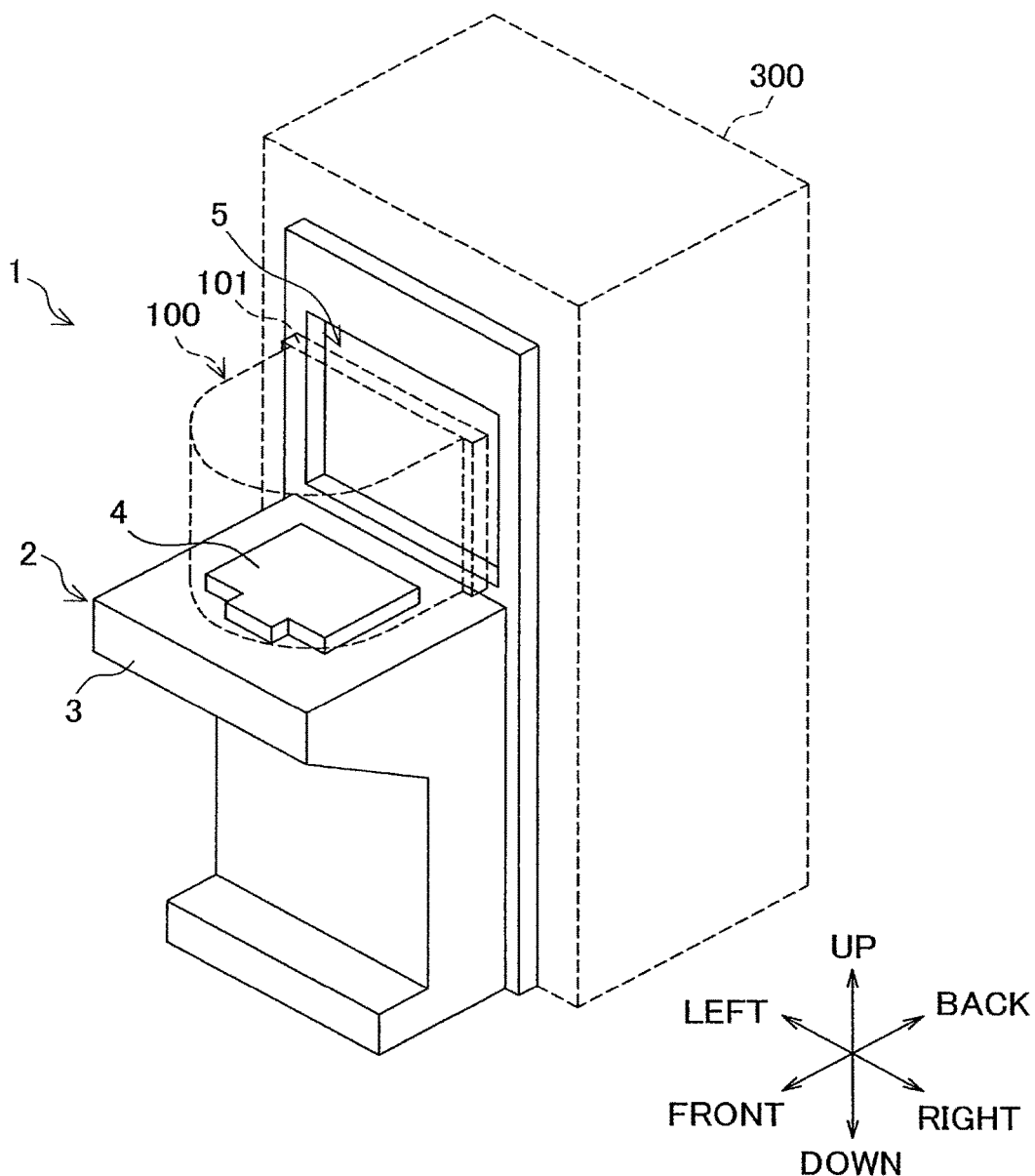
FIG. 1 is a perspective view of a load port of this embodiment.
Figure 2:
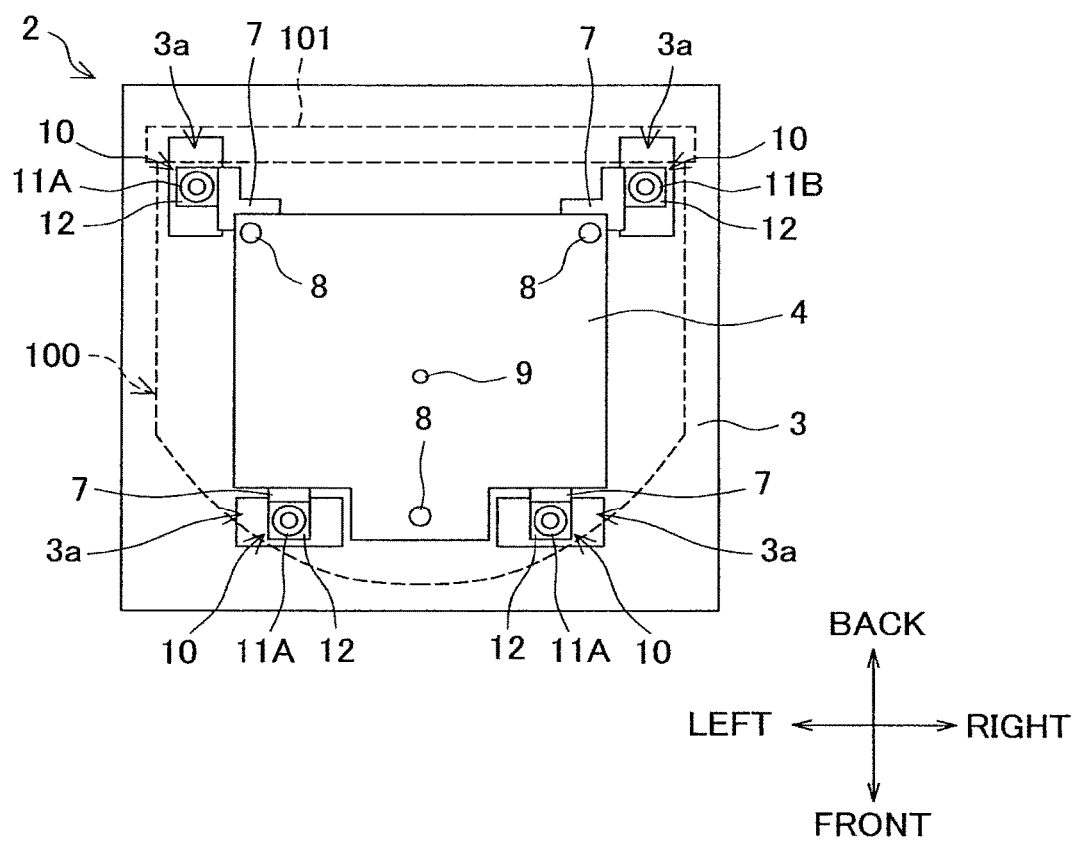
FIG. 2 is a top view of a table of the load port.

The following will describe an embodiment of the present invention with reference to the drawings. FIG. 1 is a perspective view of a load port of this embodiment. FIG. 2 is a top view of a table of the load port. The following description will be given referring to directions indicated in the drawings, as needed.

A load port 1 of this embodiment is configured to purge a FOUP 100 functioning as a container. The FOUP 100 is configured to contain a plurality of not-illustrated wafers functioning as objects to be contained. The load port 1 is provided adjacent to a semiconductor manufacturing device 300. The load port 1 includes a table 2 configured so that the FOUP 100 is placed thereon. The table 2 includes a base housing 3, and a plate-like carrier base 4 provided on the base housing 3. The FOUP 100 is placed on the carrier base 4 of the table 2.

The load port 1 has a passage opening 5 configured to allow the wafers to pass therethrough. In the state where the FOUP 100 is placed on the carrier base 4, the passage opening 5 is located behind the FOUP 100. The load port 1 includes a not-illustrated opening-closing mechanism provided to be opposed to the FOUP 100 across the passage opening 5. The opening-closing mechanism is configured to open/close a door 101 of the FOUP 100. When the opening-closing mechanism detaches the door 101 from the FOUP 100, communication through the passage opening 5 is allowed. This enables the wafers contained in the FOUP 100 to be passed to the semiconductor manufacturing device 300 through the passage opening 5. The carrier base 4 is movable in a front-back direction by a not-illustrated slider mechanism.

Although not illustrated in FIG. 1, four nozzle units 10 are provided around the carrier base 4, as shown in FIG. 2. Three of the four nozzle units 10 respectively include injection nozzles 11A each configured to inject inert gas into the FOUP 100, and the remaining one of the four nozzle units 10 includes a discharge nozzle 11B configured to discharge air from the FOUP 100. Although there is a difference in the function of the nozzle, i.e., the nozzle is for injecting gas or for discharging gas, as described above, the basic structures of the four nozzle units 10 are substantially the same. Note that, in the following description, the injection nozzles 11A and the discharge nozzle 11B may be simply referred to as nozzles 11 when there is no need to distinguish the injection nozzles 11A and the discharge nozzle 11B from each other.

Each nozzle 11 is held by a nozzle holder 12 in such a manner that the nozzle 11 protrudes upward through an opening 3a formed on a top surface of the base housing 3. Each nozzle holder 12 is coupled to a bracket 7. The nozzle holders 12 are attached, at their respective predetermined positions, to a peripheral edge of the carrier base 4 via the respective brackets 7. This enables the nozzle units 10 to be moved in the front-back direction with the carrier base 4 when the carrier base 4 is moved by the above-described slider mechanism.

On the carrier base 4, a plurality of kinematic pins 8 are provided. The kinematic pins 8 are configured to position the FOUP 100. The kinematic pins 8 protrude upward from the carrier base 4. The kinematic pins 8 are configured to be respectively engaged in not-illustrated positioning grooves formed on the bottom of the FOUP 100. With this engagement, the FOUP 100 is positioned on the carrier base 4. On a top surface of the carrier base 4, there is provided a seat sensor 9 configured to detect whether the FOUP 100 is suitably positioned on the carrier base 4.

Figure 3:
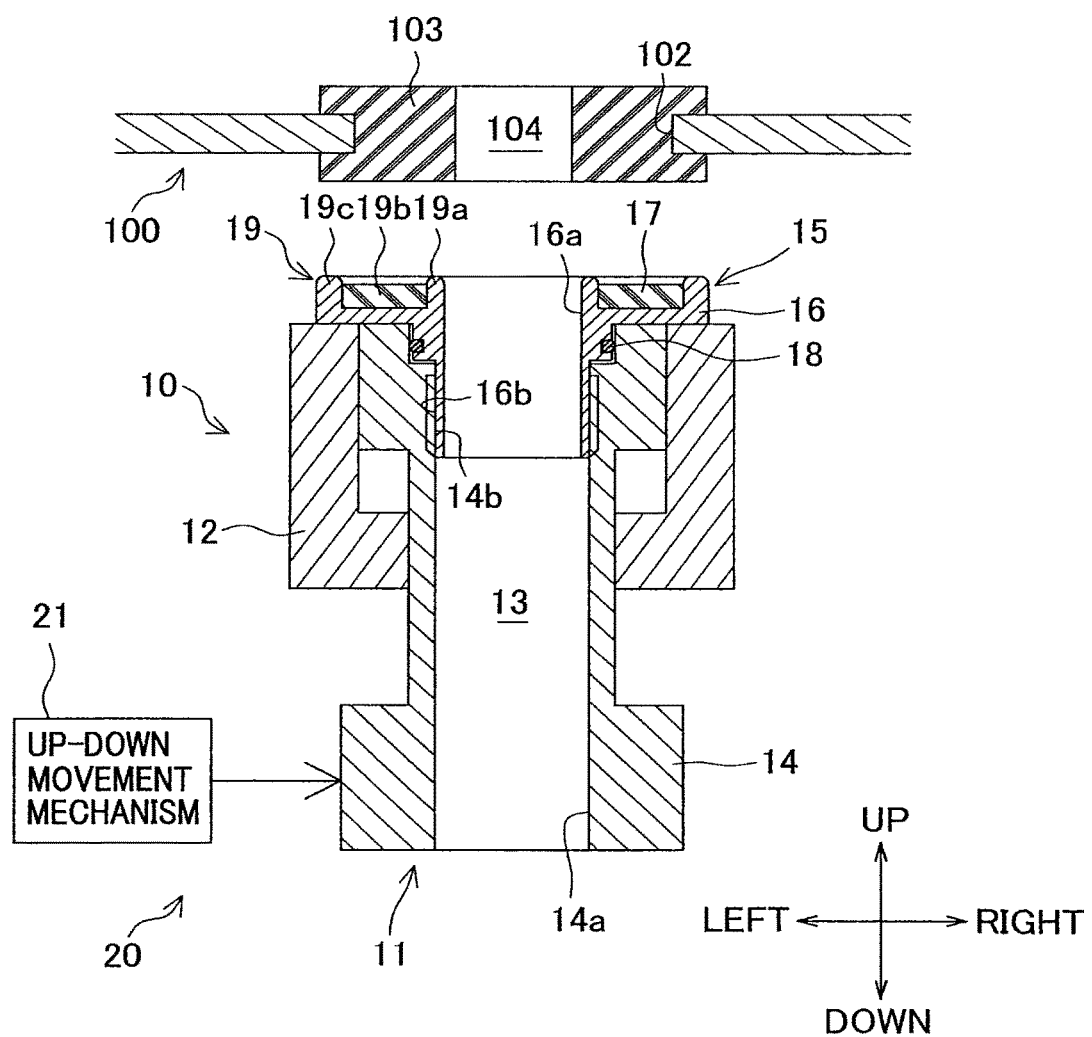
FIG. 3 is a longitudinal cross section of a nozzle unit.

FIG. 3 is a longitudinal cross section of each nozzle unit. As described above, the nozzle 11 of each nozzle unit 10 is held by the corresponding nozzle holder 12. Through the nozzle 11, a gas-flow passage 13 is formed. The gas-flow passage 13 penetrates the inside of the nozzle 11 in an up-down direction. As for each injection nozzle 11A of the nozzles 11, a lower end portion of the gas-flow passage 13 of the injection nozzle 11A is connected to piping from an inert gas supplier which is not illustrated. Examples of inert gas include nitrogen gas, helium gas, and argon gas. As for the discharge nozzle 11B of the nozzles 11, the lower end portion of the gas-flow passage 13 of the discharge nozzle 11B is connected to piping from a suction device (not illustrated) for sucking gas, such as a vacuum pump.

Figure 4:
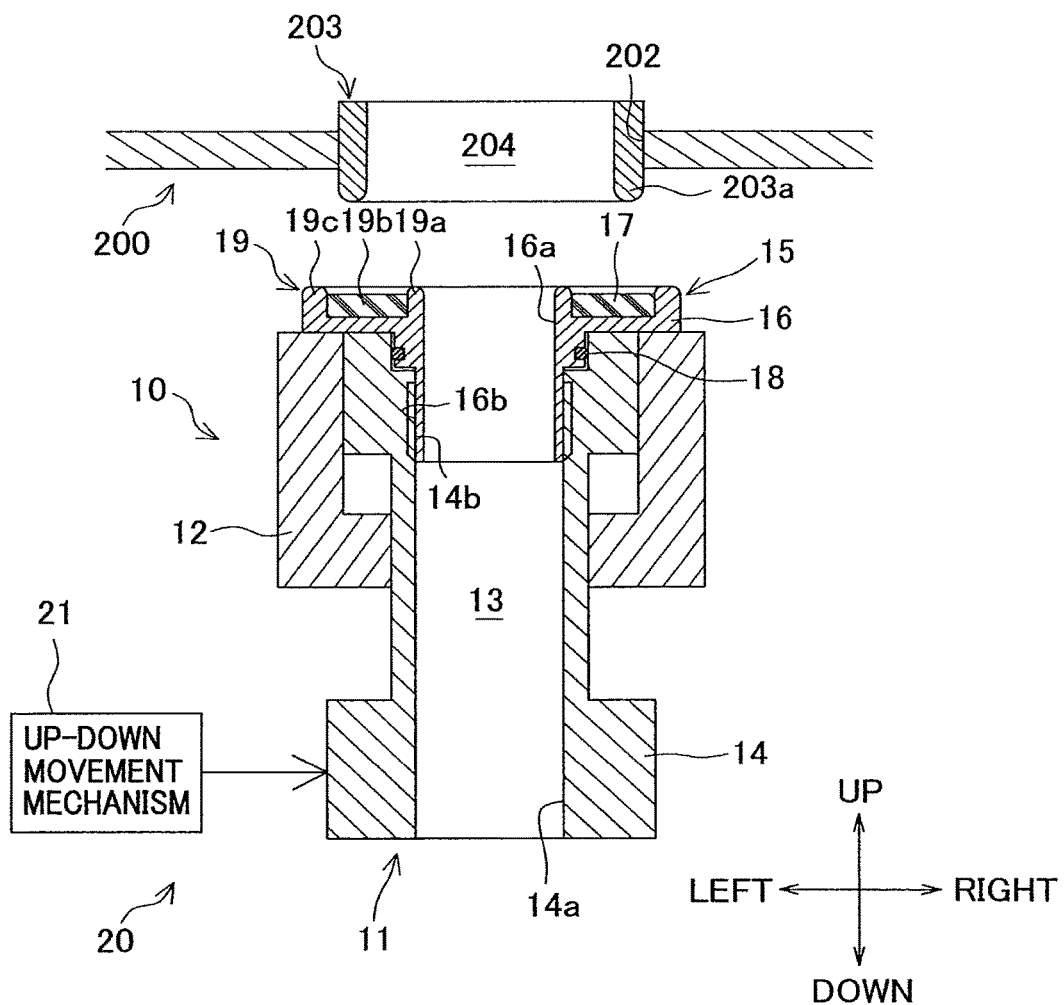
FIG. 4 is a longitudinal cross section of the nozzle unit.

Each nozzle 11 is configured to be movable up and down by an up-down movement mechanism 21. As the up-down movement mechanism 21, there may be adopted, for example, a mechanism using an air cylinder as illustrated in FIG. 4 of Patent Literature 1, or a mechanism utilizing a difference in pressure of two pressure chambers, as illustrated in FIG. 7 of Patent Literature 1. It is a matter of course that any other mechanism may be adopted. As the up-down movement mechanism 21 is driven, the nozzle 11 is moved in the up-down direction relative to the nozzle holder 12.

Each nozzle 11 is separable into a nozzle lower body 14 and a nozzle upper body 15. The nozzle 11 is constituted by the nozzle lower body 14 and the nozzle upper body 15 which are coupled to each other. The nozzle lower body 14 is made of metal. The nozzle lower body 14 has, at its central portion, a through hole 14a penetrating the nozzle lower body 14 in the up-down direction. An internal threaded portion 14b is formed at an upper end portion of the through hole 14a. Meanwhile, the nozzle upper body 15 is constituted by a main body 16 made of metal and a rubber member 17 attached onto the main body 16. The main body 16 has, at its central portion, a through hole 16a penetrating the main body 16 in the up-down direction. An external threaded portion 16b is formed at a lower end portion of the main body 16.

The nozzle 11 is assembled by screwing the external threaded portion 16b of the nozzle upper body 15 into the internal threaded portion 14b of the nozzle lower body 14. With this, the through hole 14a of the nozzle lower body 14 is connected to the through hole 16a of the nozzle upper body 15, to form the gas-flow passage 13. To prevent gas leakage between the nozzle lower body 14 and the nozzle upper body 15, an O ring 18 is provided between the nozzle lower body 14 and the nozzle upper body 15.

Now, the FOUP 100 shown in FIG. 3 is of a so-called "grommet type". The FOUP 100 has mounting holes 102 formed through its bottom, and an annular grommet 103 made of rubber is attached to each mounting hole 102. When an upper end portion of the corresponding nozzle 11 is brought into contact with the grommet 103, an opening 104 at the center of the grommet 103 communicates with the gas-flow passage 13 formed through the nozzle 11. This enables injection of gas to the FOUP 100, or discharge of gas from the FOUP 100, through the nozzle 11.

FIG. 4 is a longitudinal cross section of the nozzle unit which is the same as that shown in FIG. 3. However, a FOUP 200 shown in FIG. 4 is a so-called "lip type". The FOUP 200 has mounting holes 202 formed through its bottom, and a valve 203 is attached to each mounting hole 202. The valve 203 is of a substantially cylindrical shape and is made of plastic. The valve 203 has an annular lip member 203a. A lower end portion of the annular lip member 203a is rounded so as to protrude downward. When the upper end portion of the corresponding nozzle 11 is brought into contact with the lip member 203a, an opening 204 at the center of the valve 203 communicates with the gas-flow passage 13 formed through the nozzle 11. This enables injection of gas to the FOUP 200, or discharge of gas from the FOUP 200, through the nozzle 11.

That is to say, in the FOUPs 100 and 200, the grommet 103 and the lip member 203a respectively function as a "contacted portion" provided around the respective openings 104 and 204. Further, a contact portion 19 is provided at an upper end portion of each nozzle 11 (of the nozzle upper body 15). The contact portion 19 is configured to be brought into contact with the corresponding grommet 103 or lip member 203a. The details of the contact portion 19 will be described later.

The FOUP 100 (200) transported by a not-illustrated transportation mechanism such as an overhead transportation ("OHT") is placed on the carrier base 4 of the table 2 of the thus structured load port 1. When the seat sensor 9 detects that the FOUP 100 (200) is suitably positioned and placed, the nozzles 11 are moved upward by the respective up-down movement mechanisms 21. As a result, the contact portion 19 of each nozzle 11 is brought into contact with the corresponding grommet 103 of the FOUP 100 (the corresponding lip member 203a of the FOUP 200), and the gas-flow passage 13 is hermetically connected and communicates with the opening 104 (204).

In the above state, inert gas is injected from the inert gas supplier to the FOUP 100 (200) through the injection nozzles 11A while air in the FOUP 100 (200) is discharged by the suction device through the discharge nozzle 11B. Thus, the FOUP 100 (200) is purged with inert gas. A purging device 20 configured to purge the FOUP 100 (200) placed on the table 2 is constituted by: the table 2; the nozzle units 10 and the up-down movement mechanisms 21 installed in the table 2; the inert gas supplier; the suction device; and the like.

Figure 5:
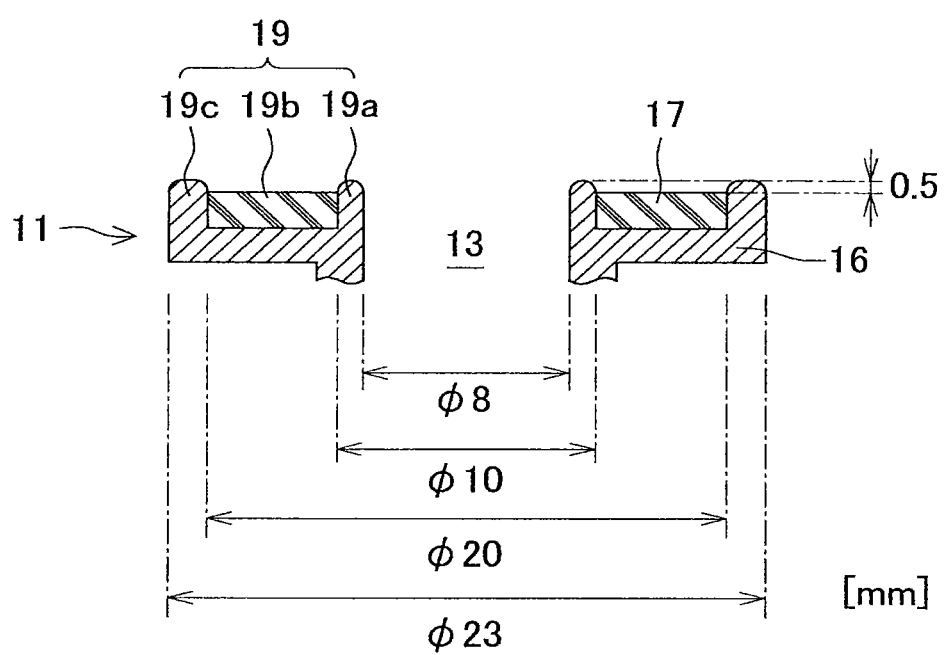
FIG. 5 is an enlarged cross section of a contact portion of a nozzle.
Figure 6A:
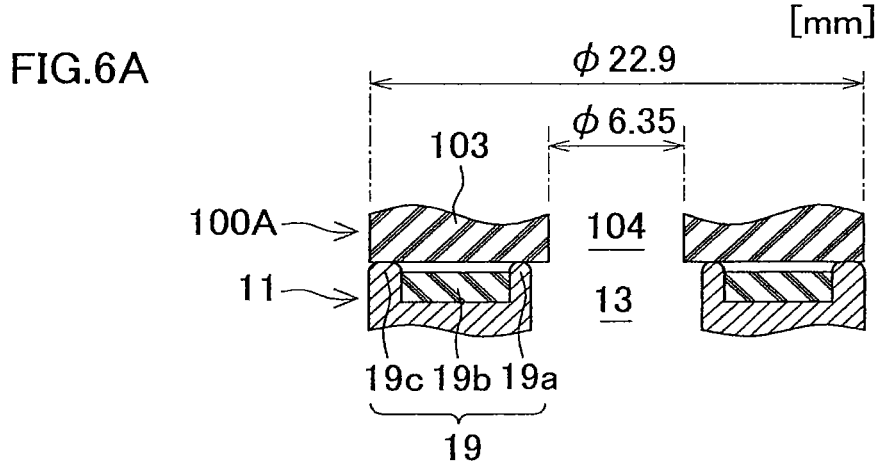
FIG. 6A is an enlarged cross section of the contact portion of the nozzle in contact with a FOUP.
Figure 6B:
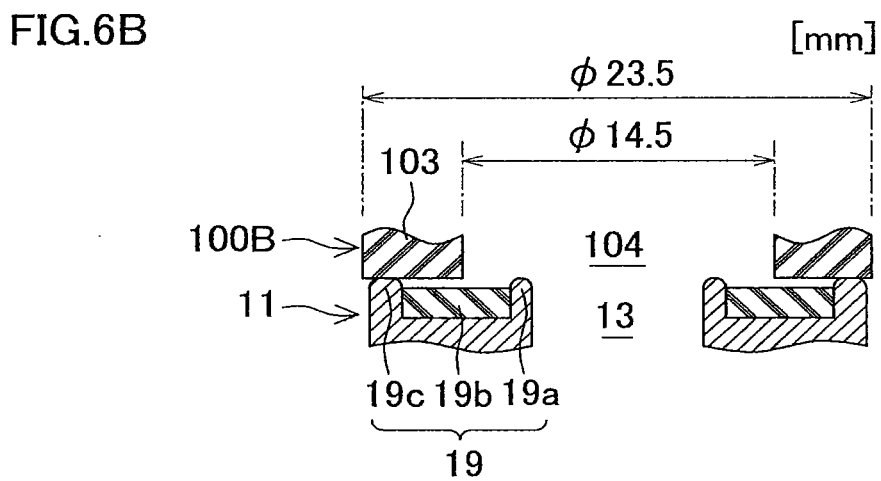
FIG. 6B is an enlarged cross section of the contact portion of the nozzle in contact with another FOUP.
Figure 6C:
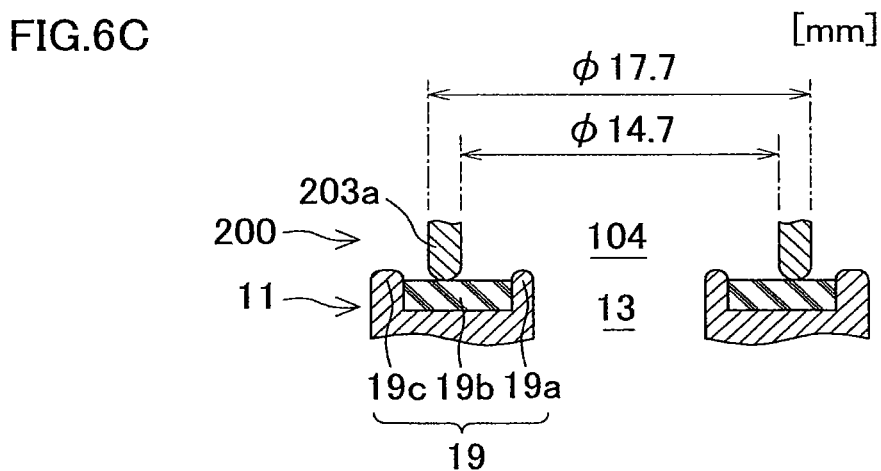
FIG. 6C is an enlarged cross section of the contact portion of the nozzle in contact with still another FOUP.

FIG. 5 is an enlarged cross section of the contact portion of the nozzle. FIG. 6A to FIG. 6C each is an enlarged cross section of the contact portion of the nozzle in contact with the FOUP. The contact portion 19 of each nozzle 11 has the shape and size shown in FIG. 5 so as to be compatible with each of the following FOUPs: a grommet type FOUP 100A shown in FIG. 6A; a grommet type FOUP 100B shown in FIG. 6B; and the lip type FOUP 200 shown in FIG. 6C.

The contact portion 19 includes an inner protruding portion 19a, a flat portion 19b, and an outer protruding portion 19c, which are provided in this order from inside to outside. In other words, the inner protruding portion 19a is the closest to the gas-flow passage 13. Each of the portions 19a, 19b, and 19c has an annular shape, and these portions 19a, 19b, and 19c are provided concentrically with one another. Each of the inner protruding portion 19a and the outer protruding portion 19c is a part of the main body 16 made of metal, which part is structured to protrude upward relative to the flat portion 19b. Respective leading end portions of the inner protruding portion 19a and the outer protruding portion 19c are rounded, and these are level with each other. In a recessed space between the inner protruding portion 19a and the outer protruding portion 19c, the rubber member 17 having a flat annular shape is placed, and this rubber member 17 forms the flat portion 19b.

As shown in FIG. 5, the inner protruding portion 19a and the outer protruding portion 19c protrude upward by 0.5 mm from a top surface of the flat portion 19b. The section width of the inner protruding portion 19a is 2 mm, the section width of the flat portion 19b is 10 mm, and the section width of the outer protruding portion 19c is 3 mm. That is, the width of the flat portion 19b is larger than that of the inner protruding portion 19a and that of the outer protruding portion 19c. Further, the width of the outer protruding portion 19c is larger than that of the inner protruding portion 19a.

Let us consider the case where the FOUP 100A is used. To the FOUP 100A, the grommets 103 each having an inner diameter of 6.35 mm and an outer diameter of 22.9 mm are attached. In this case, as shown in FIG. 6A, both of the inner protruding portion 19a and the outer protruding portion 19c of each nozzle 11 are brought into contact with an under surface of the corresponding grommet 103. Further, let us consider the case where the FOUP 100B is used. To the FOUP 100B, the grommets 103 each having an inner diameter of 14.5 mm and an outer diameter of 23.5 mm are attached. In this case, as shown in FIG. 6B, only the outer protruding portion 19c of each nozzle 11 is brought into contact with an under surface of the corresponding grommet 103. Furthermore, let us consider the case where the FOUP 200 including the lip members 203a each having an inner diameter of 14.7 mm and an outer diameter of 17.7 mm is used. In this case, as shown in FIG. 6C, the top surface of the flat portion 19b of each nozzle 11 is brought into contact with the corresponding lip member 203a.

Advantageous Effects

As described above, in this embodiment, the contact portion 19 of each nozzle 11 includes: the flat portion 19b;

and the protruding portions 19a and 19c each protruding upward relative to the flat portion 19b. Further, the flat portion 19b is made of material softer than that of the protruding portions 19a and 19c. Because of this structure, when the grommet type FOUP 100 is used, at least one of the protruding portions 19a and 19c of each nozzle 11 is brought into contact with the corresponding grommet 103 of the FOUP 100, and thereby good and close contact is established between the nozzle 11 and the FOUP 100. Meanwhile, when the lip type FOUP 200 is used, the flat portion 19b of each nozzle 11 which portion is softer than the protruding portions 19a and 19c is brought into contact with the corresponding lip member 203a of the FOUP 200, and thereby good and close contact is established between the nozzle 11 and the FOUP 200. Thus, each nozzle 11 of this embodiment is compatible with both of the grommet type FOUPs 100 and the lip type FOUPs 200.

Particularly in this embodiment, the contact portion 19 includes the plurality of protruding portions 19a and 19c. This enables compatibility with a wider variety of grommet type FOUPs 100. Further, the flat portion 19b is wider than each of the protruding portions 19a and 19c. This enables compatibility with a wider variety of lip type FOUPs 200. Moreover, the leading end portions of the protruding portions 19a and 19c are rounded. Thus, there is substantially line contact between the grommet 103 and the protruding portion 19a, 19c. As compared to the case where there is surface contact between them, better and close contact is established between the protruding portion 19a, 19c and the grommet 103.

In each nozzle 11, there is a possibility that a gap is created between an under surface of the flat portion 19b formed by the rubber member 17 and an upper surface of the main body 16 on which the rubber member 17 is placed, and this gap may function as a path of gas leakage. Thus, the inner protruding portion 19a is provided between the gas-flow passage 13 and the flat portion 19b in this embodiment. This prevents gas from reaching the above gap, to reliably prevent gas leakage.

The rubber member 17 forming the flat portion 19b is more likely to be damaged by contact with another member, for example. In this embodiment, the outer protruding portion 19c is provided outside the flat portion 19b. With this, the soft flat portion 19b is protected by the outer protruding portion 19c, and thereby damage to the flat portion 19b is prevented. Particularly in this embodiment, the outer protruding portion 19c is thicker than the inner protruding portion 19a. This increases the strength of the outer protruding portion 19c, to enhance the above-described advantageous effect.

Further, the load port 1 and the purging device 20 each including the nozzle units 10 of this embodiment are able to suitably purge both of the grommet type FOUP 100 and the lip type FOUP 200, without a need of replacing the nozzles 11 (or the nozzle upper bodies 15).

Other Embodiments

The present invention is not limited to the above-described embodiment. Combinations of components of the above embodiment, and various modifications and variations are possible within the scope of the spirit of the invention.

For example, while the description has been given of the load port 1 including the purging device 20 in the above-described embodiment, the member in which the purging device 20 is installed is not limited to the load port 1. The purging device 20 may be installed, for example, in a temporary placement device for temporary placement of the FOUP 100 (200) transported by a transportation mechanism such as an OHT, or in a stocker for storing the FOUPs 100 (200).

The above-described embodiment deals with the case where the FOUP 100 (200) functions as a container. However, a container other than the FOUP 100 (200) may be used as an object to be purged as long as the internal space of the container needs to be purged.

While in the above-described embodiment, the protruding portions 19a and 19c are made of metal and the flat portion 19b is made of rubber, the materials for these portions are not limited to these. That is, as long as the relationship that the flat portion 19b is softer than the protruding portions 19a and 19c is satisfied, the materials for the protruding portions 19a and 19c and for the flat portion 19b may be changed as needed. For example, the protruding portions 19a and 19c may be made of plastic. As a measure of the softness of a material, a suitable one may be selected from several measures, such as modulus of elasticity (Young's modulus), Vickers hardness, and durometer hardness.

In the above-described embodiment, each nozzle 11 is constituted by the nozzle lower body 14 and the nozzle upper body 15 coupled to each other. However, each nozzle 11 does not have to be separable into the nozzle lower body 14 and the nozzle upper body 15. Each nozzle 11 may be a single member.

Further, in the above-described embodiment, the contact portion 19 of each nozzle 11 includes the two protruding portions 19a and 19c. However, the number of the protruding portions may be one, or three or more. In addition, the number of the flat portions 19b is not limited to one. Two or more flat portions 19b may be provided.

Furthermore, in the above-described embodiment, the inner protruding portion 19a is provided inside the flat portion 19b and the outer protruding portion 19c is provided outside the flat portion 19b. However, either one of the inner protruding portion 19a and the outer protruding portion 19c may be omitted. The present invention merely requires that at least one protruding portion and at least one flat portion are provided. The positional relationship between the protruding portion and the flat portion is also changeable depending on the FOUP 100 (200) to be used.

Still further, in the above-described embodiment, each nozzle 11 is movable up and down by the corresponding up-down movement mechanism 21. However, the up-down movement mechanism 21 does not have to be provided. Each nozzle 11 may be unmovable in the up-down direction relative to the corresponding nozzle holder 12.

Note that, the contacted portion provided around each opening 104 (204) of the FOUP 100 (200) may have the upside-down structure of the contact portion 19 of each nozzle 11. That is, the contacted portion of the FOUP 100 (200) may include a flat portion and a protruding portion protruding downward relative to the flat portion, the flat portion being made of material softer than that of the protruding portion.

What is claimed is:

1. An end structure of a nozzle including a gas-flow passage communicable with an opening provided through a bottom of a container configured to contain an object, the nozzle being configured so that gas is injected into or discharged from the container through the gas-flow passage and the opening, the end structure comprising a contact portion provided at an upper end portion of the nozzle and around the gas-flow passage, the contact portion being configured to be brought into contact with a contacted portion provided around the opening, the contact portion including a flat portion and a plurality of protruding portions protruding upward relative to the flat portion, the flat portion being made of material softer than that of the protruding portions, the protruding portions including:

an inner protruding portion provided between the gas-flow passage and the flat portion; and an outer protruding portion provided outside the flat portion.

2. A purging device comprising: a table configured so that a container is placed thereon; and a nozzle unit installed in the table, the purging device configured so that gas is injected into or discharged from the container through the nozzle unit, the nozzle unit including the end structure recited in claim 1.

3. A load port provided adjacent to a semiconductor manufacturing device, the load port comprising: the purging device recited in claim 2; and a mechanism configured to open/close a door of a container placed on the table of the purging device.

4. The load port according to claim 3, further comprising an up-down movement mechanism configured to move up and down the nozzle, wherein when the nozzle is moved up by the up-down movement mechanism and thereby the contact portion is brought into contact with the contacted portion, the gas-flow passage is hermetically connected to and communicates with the opening.

5. The load port according to claim 3, wherein the nozzle includes a nozzle upper body including the contact portion, and a nozzle lower body, and by assembling the nozzle upper body and the nozzle lower body into the nozzle, a through hole of the nozzle upper body is connected to a through hole of the nozzle lower body, to form the gas-flow passage.

6. The load port according to claim 5, wherein the nozzle is assembled by screwing a threaded portion of the nozzle upper body with a threaded portion of the nozzle lower body.

7. The load port according to claim 5, wherein an O ring is provided between the nozzle upper body and the nozzle body.

8. An end structure of a nozzle including a gas-flow passage communicable with an opening provided through a bottom of a container configured to contain an object, the nozzle being configured so that gas is injected into or discharged from the container through the gas-flow passage and the opening, the end structure comprising a contact portion provided at an upper end portion of the nozzle and around the gas-flow passage, the contact portion being configured to be brought into contact with a contacted portion provided around the opening, the contact portion including:

a flat portion made of elastic material; and a protruding portion formed by a part of the upper end portion of the nozzle, the part protruding upward relative to the flat portion.

9. The end structure according to claim 8, wherein the elastic material is a rubber member.

10. The end structure according to claim 8, wherein the protruding portion is made of metal.

11. The end structure according to claim 8, wherein the protruding portion includes a plurality of protruding portion, and the protruding portions include:

an inner protruding portion provided between the gas-flow passage and the flat portion; and an outer protruding portion provided outside the flat portion.

12. A purging device comprising: a table configured so that a container is placed thereon; and a nozzle unit installed in the table, the purging device configured so that gas is injected into or discharged from the container through the nozzle unit, the nozzle unit including the end structure recited in claim 8.

13. A load port provided adjacent to a semiconductor manufacturing device, the load port comprising: the purging device recited in claim 12; and a mechanism configured to open/close a door of a container placed on the table of the purging device.

14. The load port according to claim 13, further comprising an up-down movement mechanism configured to move up and down the nozzle, wherein when the nozzle is moved up by the up-down movement mechanism and thereby the contact portion is brought into contact with the contacted portion, the gas-flow passage is hermetically connected to and communicates with the opening.

15. The load port according to claim 13, wherein the nozzle includes a nozzle upper body including the contact portion, and a nozzle lower body, and by assembling the nozzle upper body and the nozzle lower body into the nozzle, a through hole of the nozzle upper body is connected to a through hole of the nozzle lower body, to form the gas-flow passage.

16. The load port according to claim 15 wherein the nozzle is assembled by screwing a threaded portion of the nozzle upper body with a threaded portion of the nozzle lower body.

17. The load port according to claim 15, wherein an O ring is provided between the nozzle upper body and the nozzle body.

* * * * *